United States Patent [19]
Walia

[11] Patent Number: 6,147,884
[45] Date of Patent: Nov. 14, 2000

[54] METHOD AND APPARATUS FOR LOW-POWER CHARGE TRANSITION IN AN I/O SYSTEM OF AN INTEGRATED CIRCUIT

[75] Inventor: Rajan Walia, Singapore, Singapore

[73] Assignee: Agilent Technologies, Inc., Palo Alto, Calif.

[21] Appl. No.: 09/492,511

[22] Filed: Jan. 27, 2000

[30] Foreign Application Priority Data

Jun. 28, 1999 [SG] Singapore .......................... 9903443-1

[51] Int. Cl.[7] .................................................. H02M 3/18
[52] U.S. Cl. ............................................. 363/59; 327/111
[58] Field of Search ....................... 363/59, 60; 307/109, 307/110; 327/108, 111, 284

[56] References Cited

U.S. PATENT DOCUMENTS

| | | |
|---|---|---|
| 5,475,294 | 12/1995 | Isoda .......................................... 320/14 |
| 5,506,535 | 4/1996 | Ratner . |
| 5,574,633 | 11/1996 | Prater . |
| 5,636,809 | 6/1997 | Koch . |
| 5,638,013 | 6/1997 | Iwata et al. . |
| 5,646,809 | 7/1997 | Motley et al. . |
| 5,990,663 | 11/1999 | Mukainakano .......................... 320/134 |
| 5,998,968 | 12/1999 | Pittman et al. ........................ 320/130 |
| 6,046,613 | 4/2000 | Tamura .................................... 327/108 |
| 6,072,300 | 6/2000 | Tsuji ......................................... 320/116 |

*Primary Examiner*—Adolf Deneke Berhane

[57] ABSTRACT

Method and apparatus for low-power charge transition in an I/O system of an integrated circuit comprising an interconnected linking of stepwise charging and charge recycling of capacitive loads. The I/O system according to the invention does not need additional pins for recycling capacitors, additional silicon area for on-chip capacitors, or additional power supplies. This I/O system achieves power savings of 20% to 30% of $CV^2f$.

9 Claims, 9 Drawing Sheets

6,147,884

METHOD AND APPARATUS FOR LOW-POWER CHARGE TRANSITION IN AN I/O SYSTEM OF AN INTEGRATED CIRCUIT

The present invention relates to a method and an apparatus for low-power charge transition in integrated circuits or subsystems of an integrated circuit, more specifically to a method and an apparatus for low-power charge transition in an I/O system of an integrated circuit or of a subsystem thereof.

BACKGROUND OF THE INVENTION

Because handheld and portable electronic systems have increased in complexity, features and performance, designers have focused on low-power design techniques to help reduce the power dissipation of integrated circuits used in these systems.

Low-power design techniques, which can help reduce the power dissipation of integrated circuits used in such systems, are of great importance for handheld devices. Integrated circuits designed specifically for portable devices employ low-power techniques to achieve as low a power dissipation as possible without sacrificing performance.

Typically, I/O pads of integrated circuits dissipate a significant fraction of the total power consumed by the integrated circuit due to large capacitive loads—resulting from the parasitic capacitance of the internal or external I/O pins and pads, I/O pads of external integrated circuits, printed circuit board traces, conductors to external devices coupled to the I/O pads, etc.—that have to be driven from rail to rail (i.e. $V_{DD}$ to GND). Designers of integrated circuits have little control over either the load capacitance or the voltage swing dictated by the system requirements. Although reducing the load capacitance or the output voltage swing helps to decrease power dissipation, this is rarely an option available to designers of integrated circuits for reducing I/O power dissipation.

Several methods of designing low-power I/O pads employing concepts such as charge sharing (charge recycling) or stepwise charging have appeared in recent literature.

U.S. Pat. No. 5,574,633 discloses a multi-phase charge sharing method and apparatus, wherein existing charge from high voltage output nodes is used to charge lower voltage output nodes so that the lower voltage nodes are partially charged without requiring additional external power. Following the charge transfer, the outputs are disconnected from one another and operated in their normal fashion. U.S. Pat. No. 5,574,633 teaches an energy saving method and apparatus for charge transition in an I/O system of an integrated circuit, wherein the energy savings result from charge sharing. After the energy saving charge sharing the voltage nodes or loads are driven to the operating voltage of the I/O system in order to enable operation.

U.S. Pat. No. 5,638,013 discloses a signal transmission circuit having a plurality of signal lines for supplying potentials to load capacitances, in which each load capacitance is driven by each signal line, and each signal line can be connected to another signal line, the circuit being able to perform a charge redistribution. In this way the total amount of charge and energy consumed for charge transition can be reduced by the charge redistribution. However, this charge redistribution requires a complex circuitry in order to enable the individual connection of each signal line to another signal line. The complex circuitry leads to additional area required on the chip as well as to decreased energy savings due to the energy consumption, i.e. overhead, of this circuitry.

U.S. Pat. No. 5,646,809 discloses a high voltage-tolerant CMOS output driver and high voltage-tolerant input receiver circuit for protection of integrated circuits operating with a lower power supply voltage than externally interfaced devices with a higher power supply voltage. This design solves the problem of adapting an integrated circuit to a mixed 3/5V environment, thereby preventing the integrated circuit from being damaged by external voltages which are higher than the power supply voltage of the integrated circuit. U.S. Pat. No. 5,636,809 does not disclose any method or apparatus for saving energy or reducing the power consumption of an integrated circuit.

U.S. Pat. No. 5,506,535 discloses an I/O circuit that provides bidirectional access to an integrated circuit core which has voltage transformation capability in order to manage different voltage requirements. In order to increase the performance of the integrated circuit core, the size of its features is reduced. In turn, this reduction proportionally reduces the maximum operating voltage of the integrated circuit core. Therefore, the respective I/O circuit suitable for use with the high density integrated circuit core manages to adapt the voltage level of the integrated circuit core to the voltage level being common in the discrete environment of the intergated circuit. The teaching of U.S. Pat. No. 5,506,535 discloses voltage adaptation of integrated-circuit I/O circuits and does not teach an energy saving method or apparatus for performing a charge transition in the I/O circuit of an integrated circuit.

Therefore, according to the state of the art, either no energy saving technology is implemented in the I/O system of integrated circuits or the energy savings result from the benefits conferred by a single energy saving technology and are therefore not sufficient for high frequency integrated circuits operated under low voltage. Moreover, the realization of the above circuits often leads to complex circuits which require much additional logic and additional silicon area on an integrated circuit chip. Further, any complex additional control circuit has a considerable overhead and therefore significantly reduces the amount of energy saved.

SUMMARY OF THE INVENTION

It is an object of the invention to provide a method and an apparatus for low-power charge transition in an integrated circuit, in which the apparatus has reduced energy consumption while requiring a minimum additional chip area.

The method according to the invention is a method for low-power charge transition in the I/O circuit of an integrated circuit. Since the voltage levels of the I/O pads of the I/O circuit vary with the information represented by the voltage levels of these I/O pads, within one cycle of the integrated circuit many I/O pads of the I/O circuit have to be discharged from the operating voltage of the integrated circuit to ground and many I/O pads of the I/O circuit have to be charged from ground to the operating voltage.

According to the invention, this charge transition process comprises three steps.

First, the charge in the I/O pads, representing first capacitive loads of the integrated circuit which have to be discharged is shared between these first capacitive loads and second capacitive loads representing those I/O pads of the integrated circuit which have to be charged. During each cycle, one or more of the I/O pads of the I/O circuit of the integrated circuits may be passive, meaning that the voltage level of these passive I/O pads does not change. In this charge sharing step the first capacitive loads to be discharged are connected to the second capacitive loads to be charged for a predetermined first duration by means of respective transmission gates which are controlled by control units assigned thereto. The charge stored in the first capacitive loads is thereby shared between the first capacitive loads and the second capacitive loads. All capacitive loads of the integrated circuit participating in the charge sharing (i.e. the first and the second capacitive loads) are thereby brought (i.e. discharged and charged, respectively) to a preload voltage, resulting in all the participating capactive loads of the integrated circuits having the same voltage level after charge sharing. The preload voltage results from connecting together the first capacitive loads which are to be discharged from the operating voltage to ground with the second capacitive loads which are to be charged from ground to the operating voltage. This charge sharing represents the first step of a stepwise charging method according to the invention, wherein no power supply is needed for charging the second capacitive loads to the preload voltage.

In a second step of the method according to the invention, the second capacitive loads are charged from the preload voltage to a voltage intermediate between the preload and the operating voltages. This charging to the intermediate voltage is carried out using an intermediate power supply. Preferably, the intermediate voltage delivered from the intermediate power supply is a voltage suitable to also drive portions of the integrated circuit which can only be supplied by this intermediate voltage and not by the operating voltage which is higher than the intermediate voltage.

Finally, in the third step of the method according to the invention, the second capacitive loads are charged from the intermediate voltage to the operating voltage. This charging to the operating voltage is carried out using an operating power supply.

Simultaneous to the charging with the intermediate power supply and/or simultaneous to the charging with the operating power supply, the first capacitive loads are discharged from the preload voltage to ground.

According to the invention it is further possible to use more than one intermediate voltage supply to charge the second capacitive loads step by step to subsequent voltage levels between the preload voltage and the operating voltage before charging them to the operating voltage according to the third step discussed above. In this way an additional energy saving can be achieved. According to the invention, this embodiment is especially preferred if the integrated circuit in which the I/O system according to the invention is implemented comprises more than one intermediate power supply for driving other electronic components which can also readily be used for the implementation of the inventive method with more than one intermediate voltage charging step.

The connecting of the first capacitive loads and the second capacitive loads is preferably carried out by using corresponding transmission gates, each being interconnected between a respective capacitive load and a charge sharing bus which is formed surrounding the integrated circuit core.

The method for low-power charge transition according to the invention provides for greater energy savings than can be achieved by a mere addition of charge sharing and stepwise charging. These greater energy savings are realized by interconnected linking of charge sharing and stepwise charging, such that the first step of stepwise charging is based directly on and starts with the beneficial state of the charge sharing already carried out. By means of this combination of charge sharing and stepwise charging an adiabatic charging is approximated, thereby significantly reducing the power dissipation in the charge transfer process.

Further, the invention provides for an apparatus which is capable of implementing the inventive method. The apparatus according to the invention is a low-power charge transition I/O system of an integrated circuit. The I/O circuit of the integrated circuit comprises a plurality of capacitive loads, resulting from the parasitic capacitance formed by internal lines, internal I/O pads, I/O pads of external integrated circuits, printed circuit board traces, conductors to external devices coupled to the I/O pads, or by on-chip capacitors or off-chip capacitors, etc. In each cycle of the integrated circuit a predetermined first number of capacitive loads out of said plurality of capacitive loads is to be discharged from the operating voltage to ground and another or an equal predetermined number of second capacitive loads out of said plurality of capacitive loads is to be charged from ground to the operating voltage. Further, the remaining capacitive loads being neither included in the first capacitive loads nor included in the second capacitive loads, if any, need not change their voltage level in this particular cycle of the integrated circuit. The low-power charge transition I/O system according to the invention comprises per I/O pad representing a capacitive load a control unit, a transmission gate connected to the capacitive load and to the control unit, an intermediate driver connected to the control unit and to the capacitive load, and an operating driver connected to the control unit and to the capacitive load. Further, the charge transition I/O system according to the invention comprises an intermediate power supply which has an intermediate voltage and which is connected to the intermediate drivers, as well as an operating power supply which has the operating voltage and which is connected to the operating drivers. The control units serve as the control for sequentially connecting the second capacitive loads to be charged to the first capacitive loads to be discharged by means of the respective transmission gates, to the intermediate power supply via the respective intermediate drivers, and to the operating power supply via the respective operating drivers, respectively. Here, the control units apply a transmission signal to the transmission gate for a first duration, an intermediate signal to the intermediate driver for a second duration and an operating signal to the operating driver for a third duration. The transmission gates serve to connect the first capacitive loads to be discharged to the second capacitive loads to be charged for the first duration upon the respective transmission signal applied from the control units to the transmission gates. The intermediate drivers are interconnected between the capacitive loads and the intermediate power supply for connecting the intermediate power supply to the second capacitive loads to be charged for the second duration upon the respective intermediate signal applied from the control units to the intermediate drivers. The operating driver is interconnected between the capacitive loads and the operating power supply in order to connect the operating power supply to the second capacitive loads for the third duration upon the respective operating signal applied from the control units to the operating drivers.

The first capacitive loads to be discharged are preferably connected to the second capacitive loads to be charged via a charge sharing bus when the transmission gates are turned on. The control units which have to be synchronized to each other may be united into a single control device. The transmission gates, the intermediate drivers and the operating drivers can be arranged on one integrated circuit chip. The integrated circuit chip can further comprise the intermediate power supply and the operating power supply.

The method and the apparatus according to the invention are technology independent, meaning that they are not restricted to any particular intermediate and operating voltage levels. As examples, they work for 5V (operating voltage) and 3V (intermediate voltage) technology, 3.3 and 2.5 volts technology and 2.5 and 1.8 volts technology, etc.

In the following the method of the combined charge recycling and stepwise charging according to the invention is discussed in detail. For illustration purposes, this detailed description of the invention is based on the example of 5 and 3 volts for the operating and intermediate voltages, respectively.

A CMOS driver driving a capacitive load C dissipates a dynamic power of $CV^2f$. Of this power, $\frac{1}{2}CV^2f$ is stored in the load capacitor C at the end of a rising transition and $\frac{1}{2}CV^2f$ is dissipated across a charging PMOS device. On a falling edge, the energy stored in the capacitive load is dissipated across a discharging NMOS device. The energy flowing out of the power supply during charging a capacitive load from $V_1$ to $V_2$ is given by $$E = \int P dt = \int V I dt = Vdd \int C\frac{dv}{dt}dt = Vdd.C.\int_{v1}^{v2} dv$$

E=C*Vdd*Vsw

Wherein $V_{dd}$ is the power supply voltage and $V_{SW}$ is the voltage swing across the load capacitance C, i.e. the amount of voltage change on the capacitive load.

If the charging of the capacitive load is performed in two steps with the first step charging the capacitive load from GND to an intermediate voltage $V_{int}$ and the second step charging the capacitive load from the intermediate voltage to an operating voltage $V_{dd}$, the energy flowing out of the power supplies supplying $V_{int}$ and $V_{dd}$, respectively, per rising edge is given by E=C*$V_{int}$*$V_{int}$+C*Vdd*(Vdd-$V_{int}$)

According to the state of the art, charging a capacitive load is performed in one step from ground to $V_{dd}$. The energy required to charge a capacitive load from ground to 5V from a 5V supply is E=C*5*5=25C joules However, according to the invention this charging is carried out in two steps. In a mixed voltage environment, e.g. in a system where both a 3V power supply and a 5V power supply are present, the respective power supplies are used for this stepwise charging. Therefore, the energy required for stepwise charging a capacitive load from ground to 5V is:

E=C*3*3+C*5* (5–3)=19C joules

Stepwise charging a capacitive load from ground to 5V by means of a 3V power supply and a 5V power supply requires 6C joules less energy than charging a capacitive load from ground to 5V using only the 5V supply. Therefore, by using stepwise charging according to the invention, 24% energy can be saved.

Further according to the invention, a fraction of the energy which is conventionally lost during a falling transition of a capacitive load to be discharged can be saved on a "recycle" capacitor and reused later, i.e. a charge recycling (charge sharing) is carried out.

From the energy stored in a capacitive load $C_{load}$ charged to $V_{DD}$ the following amount can be stored on a discharged recycle capacitor $C_{recyc}$:

$E_{saved}=\frac{1}{2}*C_{recyc}*V_{recyc}2=C_{recyc}*[(C_{load}*VDD^2)/(C_{recyc}+C_{load})]$ For the sake of simplicity, assume $C_{load}=C_{recyc}=C$. The capacitive load C is charged to $V_{dd}$ and the recycle capacitor C is discharged. At the beginning of charge sharing the load capacitor stores $\frac{1}{2}CV_{dd}^2$. After charge sharing both capacitors are charged to $V_{dd}/2$. Each of them stores $\frac{1}{8}CV_{dd}^2$ joules of energy and $\frac{1}{4}CV_{dd}^2$ is dissipated, i.e. for $C_{load}=C_{recyc}=C$ 50% of the energy initially stored in the capacitive load is lost during charge sharing.

The energy saved in the recycling capacitor can be shared with another capacitive load on a rising transition. However, using separate recycling capacitors every charge recycling step would necessarily detract from the energy-saving nature of the invention.

According to the invention, in order to minimize this detraction, the recycling capacitor $C_{recycle}$ is formed by those capacitive loads that are going to have a simultaneous high transition, and in one charge recycling cycle, the energy is transferred directly from the discharging capacitive loads to the charging capacitive loads.

By sharing charge between $C_{load}$ and $C_{recyc}$ 25% of the energy initially stored on the load capacitor can be saved. $C_{recyc}$ still retains an amount of energy equal to $E_{saved}$ and the rest of the energy is dissipated in the process of charge sharing. Charge sharing energy is not provided by any of the power supplies (i.e. intermediate and operating power supplies) but comes from other load capacitors to be discharged, thereby charging the load capacitors to be charged to said preload voltage. This improves the efficiency of stepwise charging by creating an additional step since the 3V supply (i.e. the intermediate power supply) now charges the load from said preload voltage to the intermediate voltage of 3V in the present case. Ideally charge sharing leads to a preload voltage of $V_{dd}/2$ i.e. 2.5V in a 5V system, so that the energy drawn from the 3V power supply and from the 5V power supply to charge the capacitive load to the operating voltage is given by E=C.3.(3–Vint)+C.5.(5–3)=C.3.0.5+C.5.2=11.5C This represents a more than 50% savings as compared to the conventional case of 25C. However, the effective voltage that can be achieved in charge sharing depends on the RC time constant and reliability constraints imposed in the implementation of the inventive concepts, e.g. in a 0.5 $\mu$m technology integrated circuit.

Preferred embodiments of the invention will become more apparent from the following detailed description of these embodiments when taken in conjunction with the accompanying drawing.

According to a preferred embodiment of the invention, a method for low-power charge transition in an integrated-circuit I/O system which comprises a plurality of capacitive loads which convert between a charged state at an operating voltage and a discharged state at ground during each of operation cycles of the I/O system is provided. In this way, the operation cycles are predetermined by an external clock signal. A first number of capacitive loads having the charged state converts from the charged state to the discharged state at ground, and a second number of capacitive loads having the discharged state converts from the discharged state to the charged state at the operating voltage, the first and second numbers of capacitive loads being members of the plurality of capacitive loads. According to the preferred embodiment, the charge of said first number of capacitive loads being charged to the operating voltage is shared between said first number of capacitive loads and said second number of capacitive loads being discharged, thereby charging said second number of capacitive loads from the ground to a preload voltage and discharging the first number of capacitive loads from the operating voltage to the preload voltage. Then, said second number of capacitive loads charged to the preload voltage are charged from the preload voltage to an intermediate voltage between the preload voltage and the operating voltage. The intermediate voltage is a voltage suitable for driving portions of the integrated circuit which can not be driven using the operating voltage which is higher than the intermediate voltage. Then, said second number of capacitive loads charged to the intermediate voltage are charged from the intermediate voltage to the operating voltage. During the charge sharing step said second number of capacitive loads are connected to said first number of capacitive loads for a predetermined first duration by means of transmission gates, thereby sharing the charge stored in said first number of capacitive loads between said first number of capacitive loads and said second number of capacitive loads, wherein the control units provide the transmission gates with a transmission signal turning on the transmission gates for bidirectional current flow for the predetermined first duration. During charge sharing, said second number of capacitive loads and said first number of capacitive loads are preferably connected via the transmission gates to a charge sharing bus being common for all of the capacitive loads.

Preferably, said first number of capacitive loads being discharged to the preload voltage are further discharged from the preload voltage to ground during the step of charging said second number of capacitive loads from the preload voltage to the intermediate voltage and/or during the step of charging said second number of capacitive loads from the intermediate voltage to the operating voltage.

Figure 8:
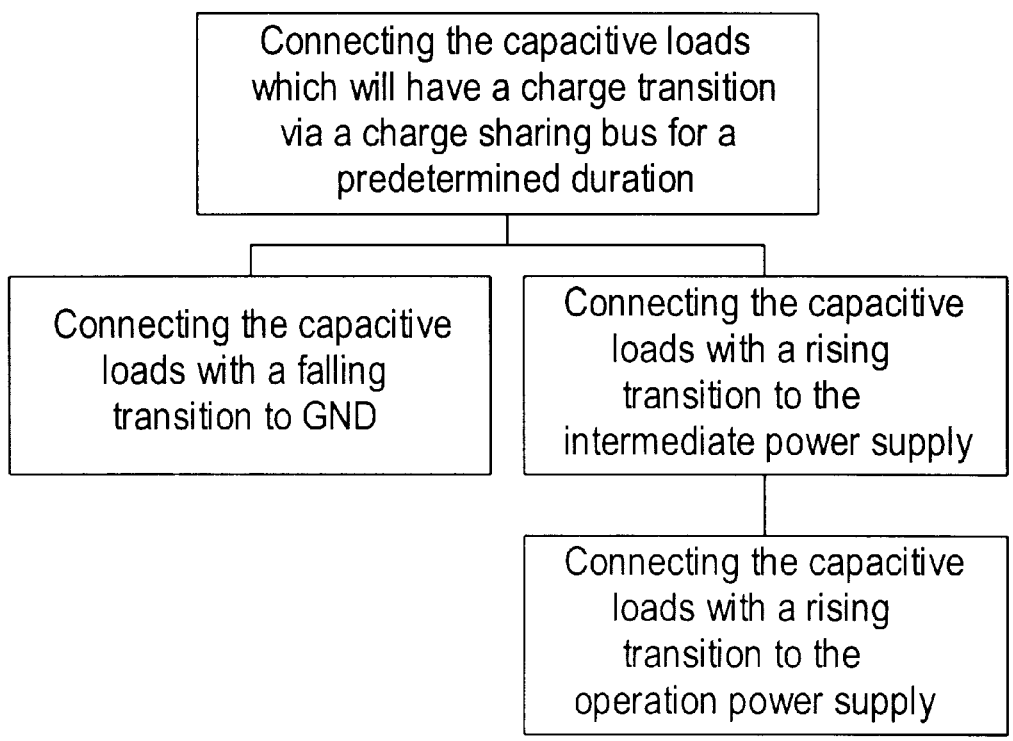
FIG. 8 shows a flow chart of the inventive method.

In other words, the method according to the preferred embodiment of the invention starts with connecting together all I/O pads of an integrated-circuit I/O system which will have a charge transition, i.e. the voltage level of some I/O pads will change from a voltage representing the logical HIGH level to a voltage representing the logical LOW level and the voltage level of others of the I/O pads will change from the voltage representing the logical LOW level to the voltage representing the logical HIGH level, as can be seen from FIG. 8, for a predetermined duration via a charge sharing bus and transmission gates using control units to turn on the transmission gates for the predetermined duration, thereby partially charging the I/O pads which have to change from LOW to HIGH and partially discharging the I/O pads which have to change from HIGH to LOW. Thereafter, the I/O pads changing from HIGH to LOW are connected to ground via N-drivers using the control units to control the N-drivers, and the I/O pads changing from LOW to HIGH are connected to an intermediate power supply via intermediate P-drivers using the control units and are charged to an intermediate voltage. Then, the I/O pads changing from LOW to HIGH are connected to an operating power supply via operating drivers using the control units and are charged to the operating voltage.

The method according to the invention can be applied to any kind of integrated circuit, e.g. memories, bit line precharge, word line drivers, inside ASICs, clock signal drivers, internal bus drivers, etc. Further, the method according to the invention can be used for low-power driving of any kind of capacitive load, such as the I/O pads, the lines, internal parasitic capacitors of an integrated circuit, external lines, I/O pads or external parasitic capacitors, etc.

Figure 1:
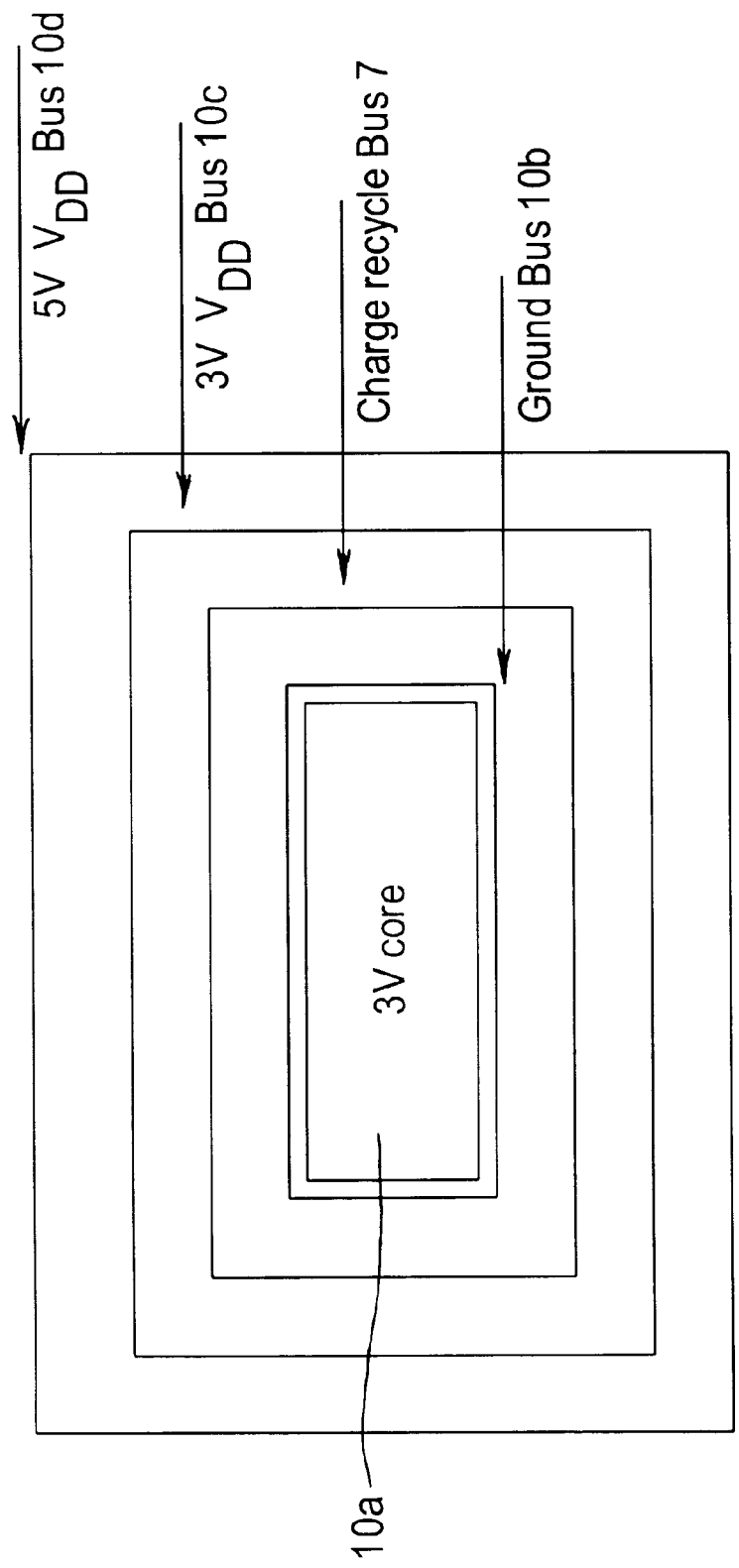
FIG. 1 shows a schematic plan view of a low-power I/O system of a preferred embodiment of the invention.

FIG. 1 shows a schematic plan view of an integrated circuit according to a preferred embodiment of the invention. The center of the circuit is a 3V core circuit 10a which implements all the logic functions of the integrated circuit and further comprises the I/O systems having the control units, the transmission gates and the drivers necessary to carry out the method according to the invention. This 3V core circuit 10a is surrounded by a ground bus 10b, a charge sharing bus 7, a 3V power supply bus 10c connected to the 3V power supply (not shown) and a 5V power supply bus 10d connected to the 5V power supply (not shown).

Figure 2:
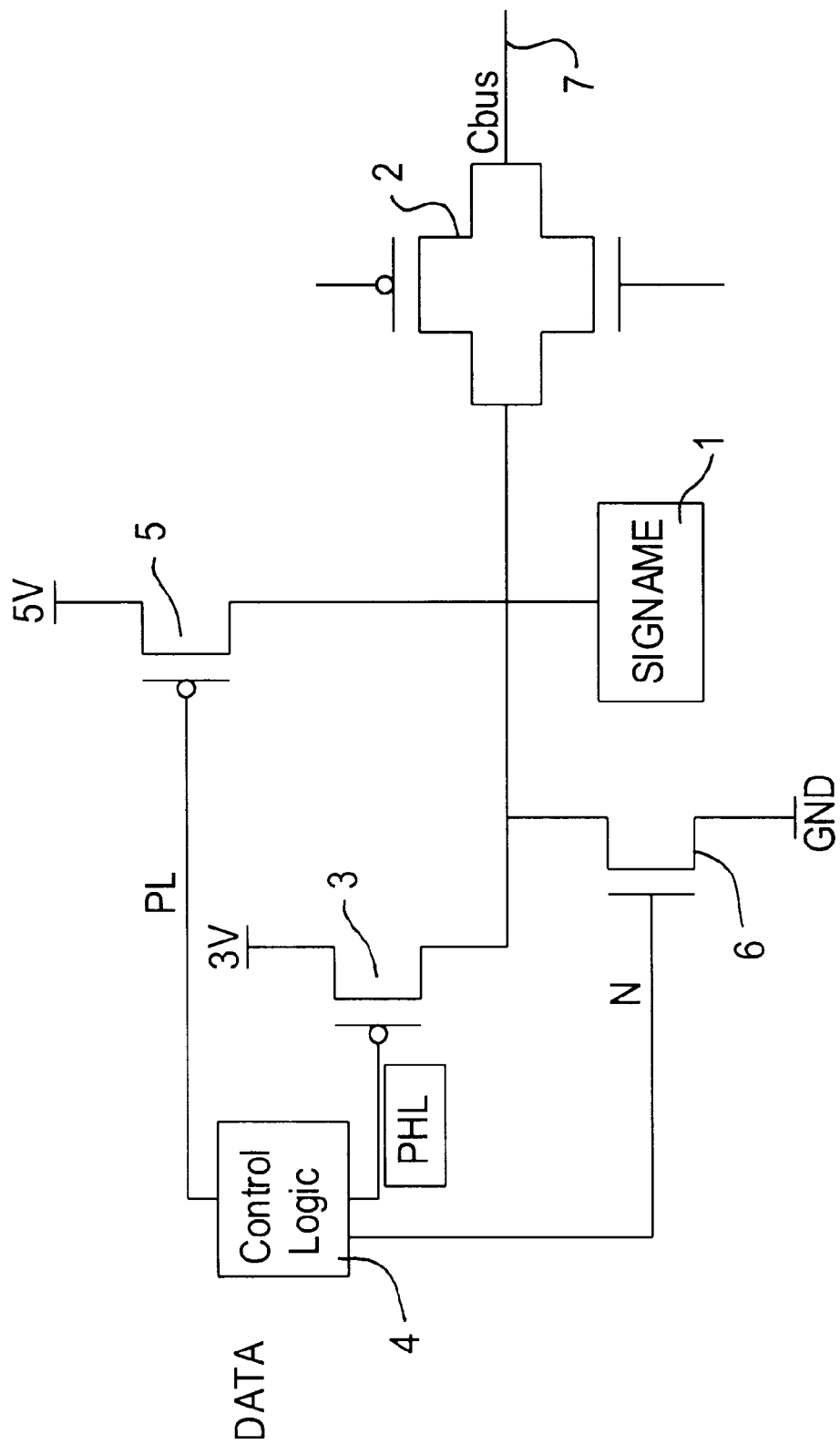
FIG. 2 shows the circuitry of the preferred embodiment of the low-power I/O system according to the invention in 5V technology.

FIG. 2 shows the circuitry of a conceptual implementation of an I/O system of an integrated circuit which will enable combined stepwise charging and charge sharing according to the invention. An I/O pad 1 is connected to a transmission gate 2, a 3V P-driver 3, a 5V P-driver 5 and a N-driver 6. A control unit 4 is connected to the transmission gate, the drivers 3, 5, and 6 and to the DATA line. The source of the 3V P-driver 3 is connected to a 3V intermediate power supply (not shown) in order to drive the I/O pad 1 to 3V. The source of the 5V P-driver 5 is connected to a 5V operating power supply (not shown) in order to drive the I/O pad 1 to 5V. The control unit 4 controls the timing of the drivers 3, 5 and 6, and of the transmission gate 2. The I/O pad 1 is connected to the charge sharing bus $C_{bus}$ 7 via the transmission gate 2 being controlled by the control unit 4. The transmission gate 2 provides for bidirectional current flow for charge sharing via the charge sharing bus $C_{bus}$ 7, for reduced charging time, and for reduced energy loss. Bidirectional current flow enables that I/O pads 1 to be discharged can supply charge to the charge sharing bus $C_{bus}$ 7 and that I/O pads 1 to be charged can receive charge from the charge sharing bus $C_{bus}$ 7.

In order to generate a rising edge of the signal SIGNAME on the I/O pad, the transmission gate 2 is turned on first by a preload signal output by the control unit 4. This generates a first step on the SIGNAME output to a preload voltage determined by charge sharing. The current is drawn from charge sharing bus $C_{bus}$ 7 which runs around the chip and connects to every charge sharing I/O pad. All I/O pads which are going high will draw power from this charge sharing bus 7 and all pads that are going low will simultaneously supply power through this charge sharing bus 7.

Additional on-chip capacitors can be connected to this charge sharing bus 7 wherever space between the I/O pads 1 or additional area in power pads permits.

All I/O systems of the integrated circuit have a transition detection logic included in their control unit 4 that turns on the transmission gate 2 for the first duration due to a data transition.

The I/O pad voltage rises exponentially to the preload value determined by charge sharing. The RC time constant is determined by the size of the pass transistors in the transmission gate 2 as well as by the value of the capacitive loads participating in charge sharing. After 3 time constants the I/O pad is charged to 90% of its final energy content. Continuing the charge sharing further will yield diminishing returns and will increase the value of $T_{rise}$, the rise time of the SIGNAME signal on the pad output. An optimal value for the charge sharing pulse width is chosen.

Figure 3:
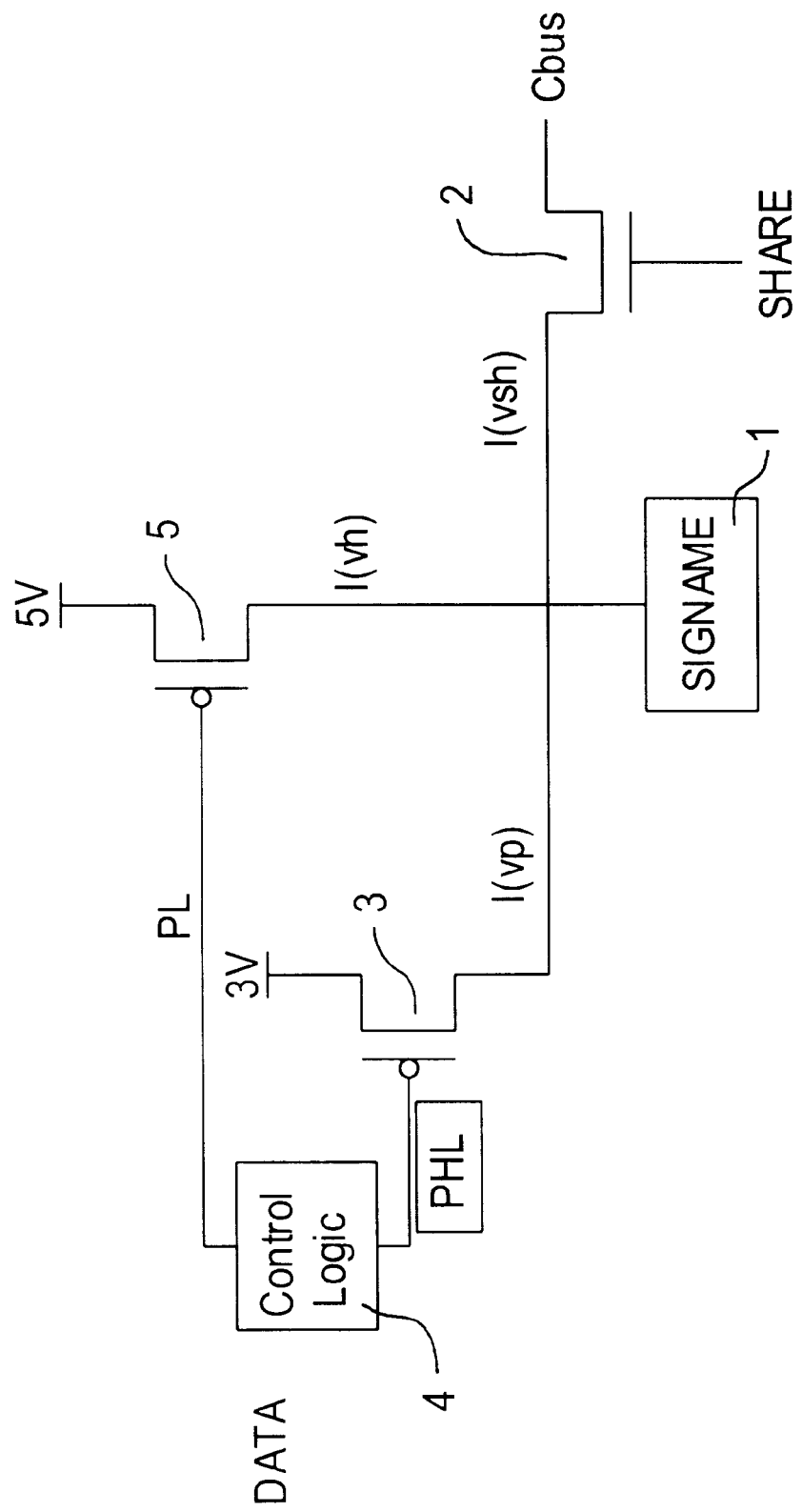
FIG. 3 shows a pull-up stage of the preferred embodiment shown in FIG. 2.

FIG. 3 shows the pull-up stage of the low-power I/O system according to the preferred embodiment of the invention. The shown currents flowing in the direction to the I/O pad are I(vsh) from the charge sharing bus $C_{bus}$ via the transmission gate 2, I(vp) from the intermediate power supply (not shown) via the 3V P-driver 3 and I(vh) from the operating power supply (not shown) via the 5V P-driver 5.

After charge sharing via the charge sharing bus $C_{bus}$ is performed, the 3V P-driver 3 charges the I/O pad to 3V and the 5V P-driver 5 charges the I/O pad to 5V. In order to ensure that the transistor terminal voltages do not exceed their reliability tolerances, the signals VREF1N and VREF1P (not shown) are supplied to the I/O system as intermediate voltage sources from an external bias voltage generator system.

The gate of the 3V P-driver 3 is driven by a 5V buffer (not shown). In the off state it is at 5V, preventing the flow of current from the 5V P-driver 5 into 3V P-driver 3.

The 3V pull-up circuitry has 5V tolerant design and ensures that no current path exists from the 5V power supply to the 3V power supply.

The operation of the P drivers which are connected to and controlled by the control unit 4 is as follows:

A delayed version of the input DATA signal to the I/O pad 1 is used to turn on the charge sharing pass transistor of the transmission gate 2 for the first duration set by an RC time constant. This is followed by a turning on of the 3V driver 3 for the second duration. Finally the 5V driver 5 is turned on for the third duration. The amounts of time the charge sharing NMOS pass device of the transmission gate 2 followed by the 3V P-driver 3 are turned on is determined by the DATA to SIGNAME delay time requirement.

Figure 4:
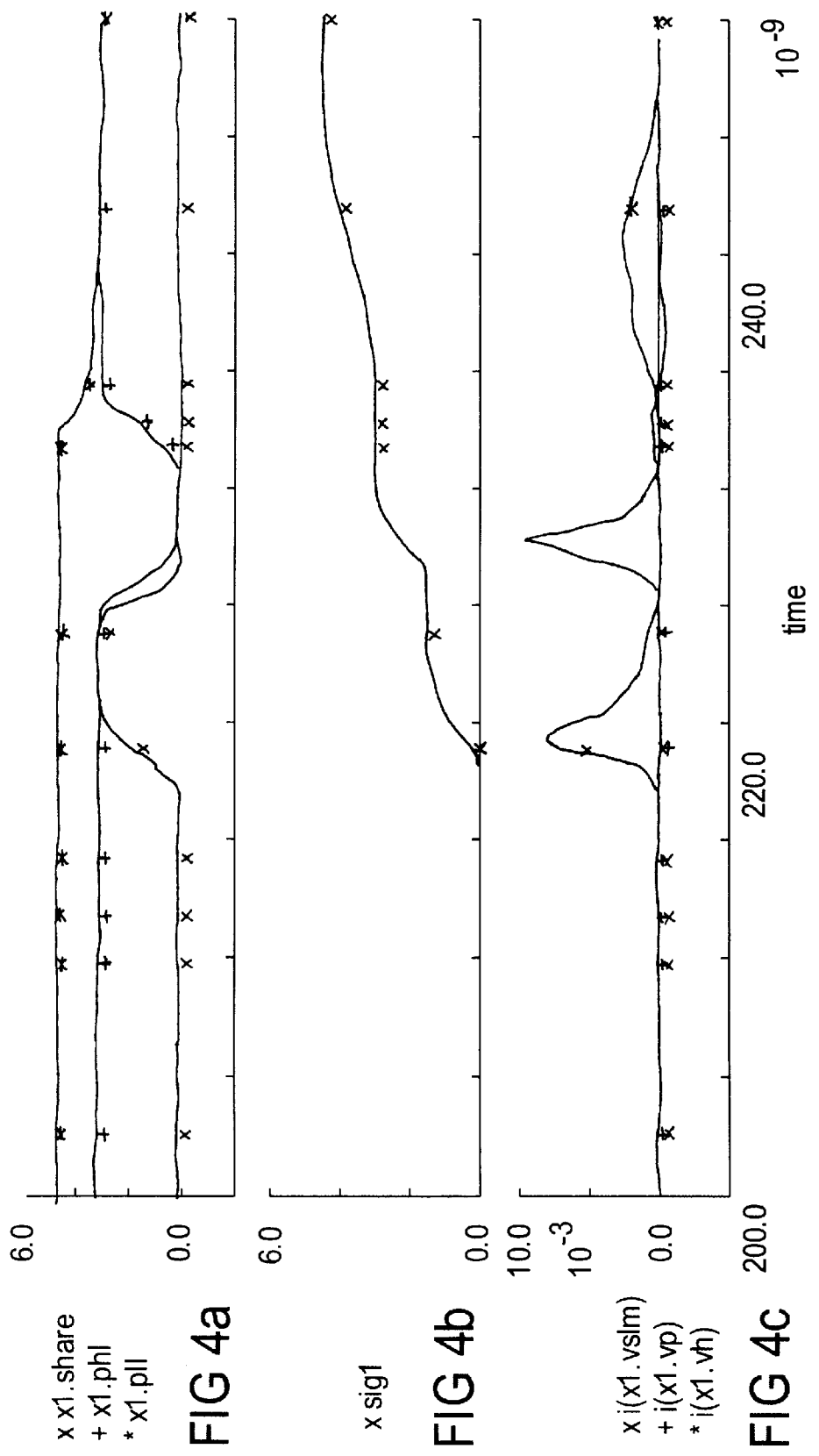
FIG. 4 shows a signal graph of the signals in the pull-up stage shown in FIG. 3.

FIG. 4 shows the pull-up sequence of various signals during the pull-up stage shown in FIG. 3. The X1.share pulse or transmission signal turns on the charge sharing pass transistor of the transmission gate 2 for the first duration. This causes a current I(x1.vsh) to flow from discharging I/O pads to the charging I/O pads. The I/O pads charge to the preload voltage of approx 1.6v. Next the 3V P-drivers 3 are turned on by the intermediate signal x1.phl for the second duration causing the current pulse I(vp) from the intermediate power supply causing the I/O pads to charge to 3V. Finally the 5V driver 5 is turned on by the operating signal x1.pll for the third duration causing the current pulse I(vh) from the operating power supply causing the I/O pads to charge to 5V. The stepped profile of signal X.SIG.1 shown in FIG. 4 represents the stepwise charging with charge sharing of the I/O pads according to the preferred embodiment of the invention.

Figure 5:
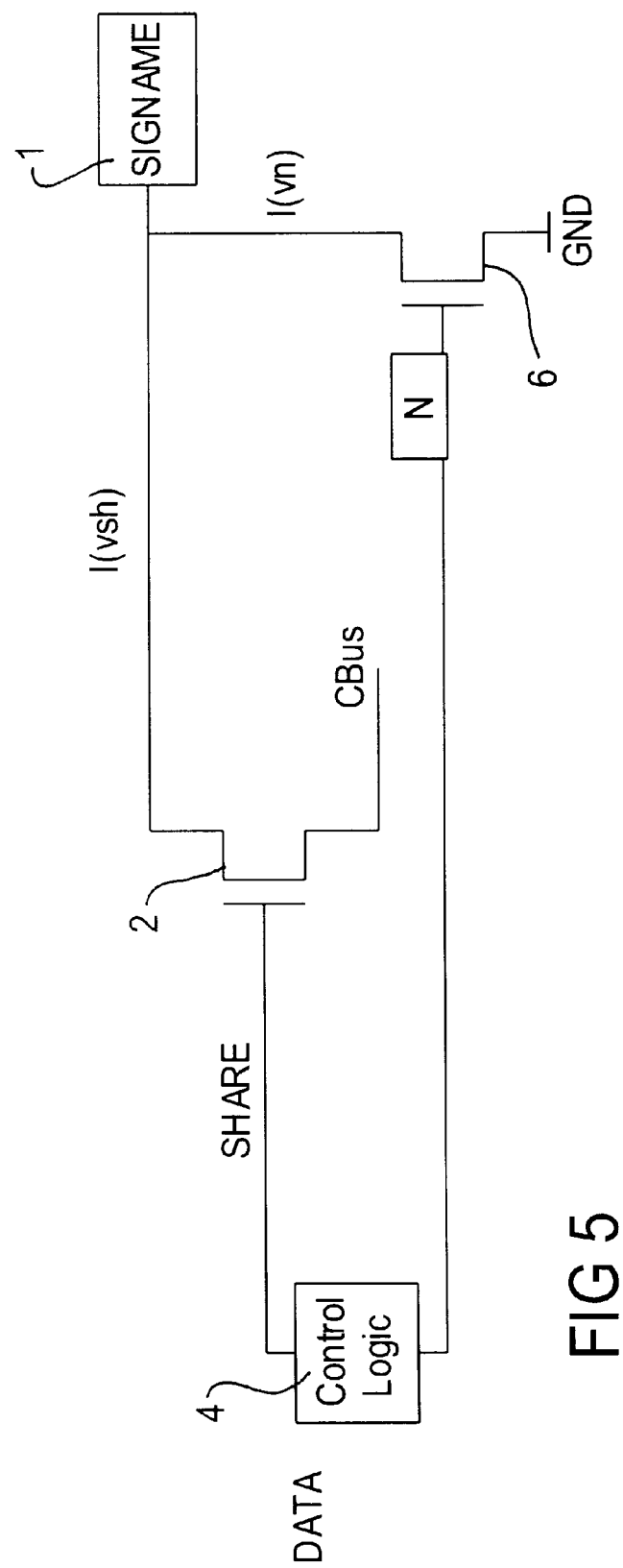
FIG. 5 shows a pull-down stage of the preferred embodiment shown in FIG. 2.
Figure 6:
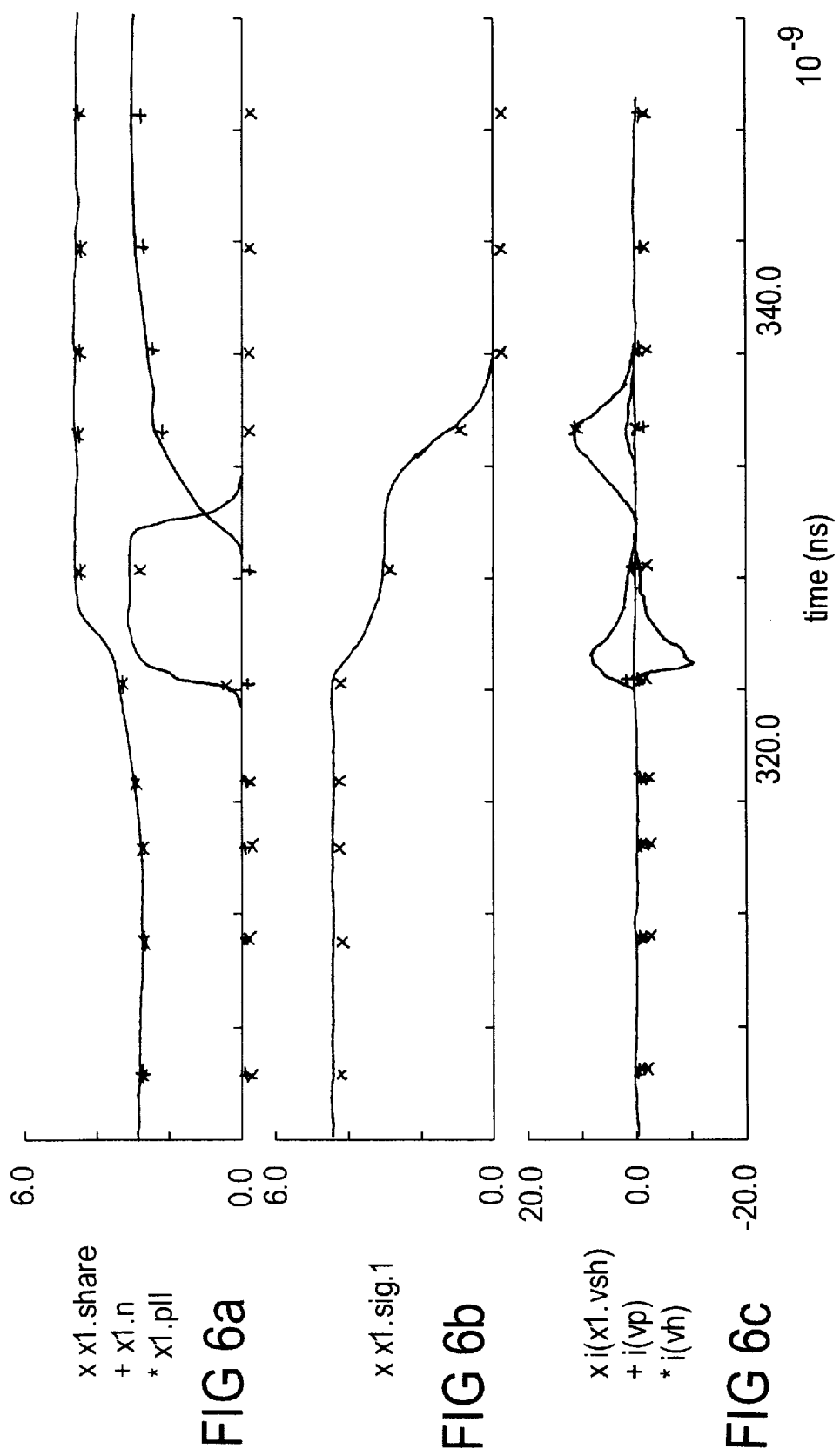
FIG. 6 shows a signal graph of the signals in the pull-down stage shown in FIG. 5.

FIG. 5 shows the pull-down stage of the low-power I/O system according to the preferred embodiment of the invention. A charge sharing pass transistor of the transmission gate 2 is connected to the charge sharing bus Cbus, the I/O pad 1 and the control unit 4. A N-type pull-down driver 6 is connected to the I/O pad 1, to the control unit 4 and to the ground. The pull-down stage works as follows:

As can be seen from FIG. 6, upon a falling transition of DATA, the 5V P-driver 5 is turned off followed by turn on of the charge sharing NMOS pass transistor of the transmission gate 2. The charge sharing pass transistor of the transmission gate 2 is turned on for the first duration. The turn on of the N-driver 6 is delayed to provide time for charge sharing. The staggered discharge sequence produces a stepwise discharge profile as shown by signal x.sig.1 in the timing diagram of FIG. 6.

The x1.pll control signal turns off the P-driver 5. Charge sharing follows as shown by enabling pulse x1.share for the N pass device of the transmission gate 2. This causes a discharge of the I/O pads to the preload voltage due to charge sharing with other I/O pads. The remaining energy is wasted or dumped to ground when the N-driver 6 turns on (x1.N).

The various control pulses of the control circuitry are generated by using RC delay elements and gating delayed version of the input signal. The switching current consumed by the control circuitry, i.e. the control units, the transmission gates and the drivers, represents an energy consumption which reduces the feasible power saving. Therefore, the RC delay elements are designed with large R components as opposed to weak inverters loaded by heavy C components, thereby reducing the overhead of the control circuitry.

Furthermore, in order to ensure proper operation, the control pulses are generated by the control circuitry in such a sequence as to prevent overlapping of the respective charging and discharging steps. In particular, the charging of the I/O pads from the intermediate power supply should be started only after the completion of the charge sharing step without overlapping between these two steps, since such an overlapping would cause a current to flow from the intermediate power supply instead of flowing from the discharging I/O pads to the charging I/O pads during charge sharing. Similarly, the charging from the operating power supply should be started only after completion of the charging from the intermediate power supply without overlapping in order to prevent a transient current flow between these power supplies. Finally, the control pulses for the pull-up and pull-down stages should be generated by the control circuitry such as to prevent overlapping transitions of these stages, thereby preventing a crossover current between power supply and ground.

Figure 9:
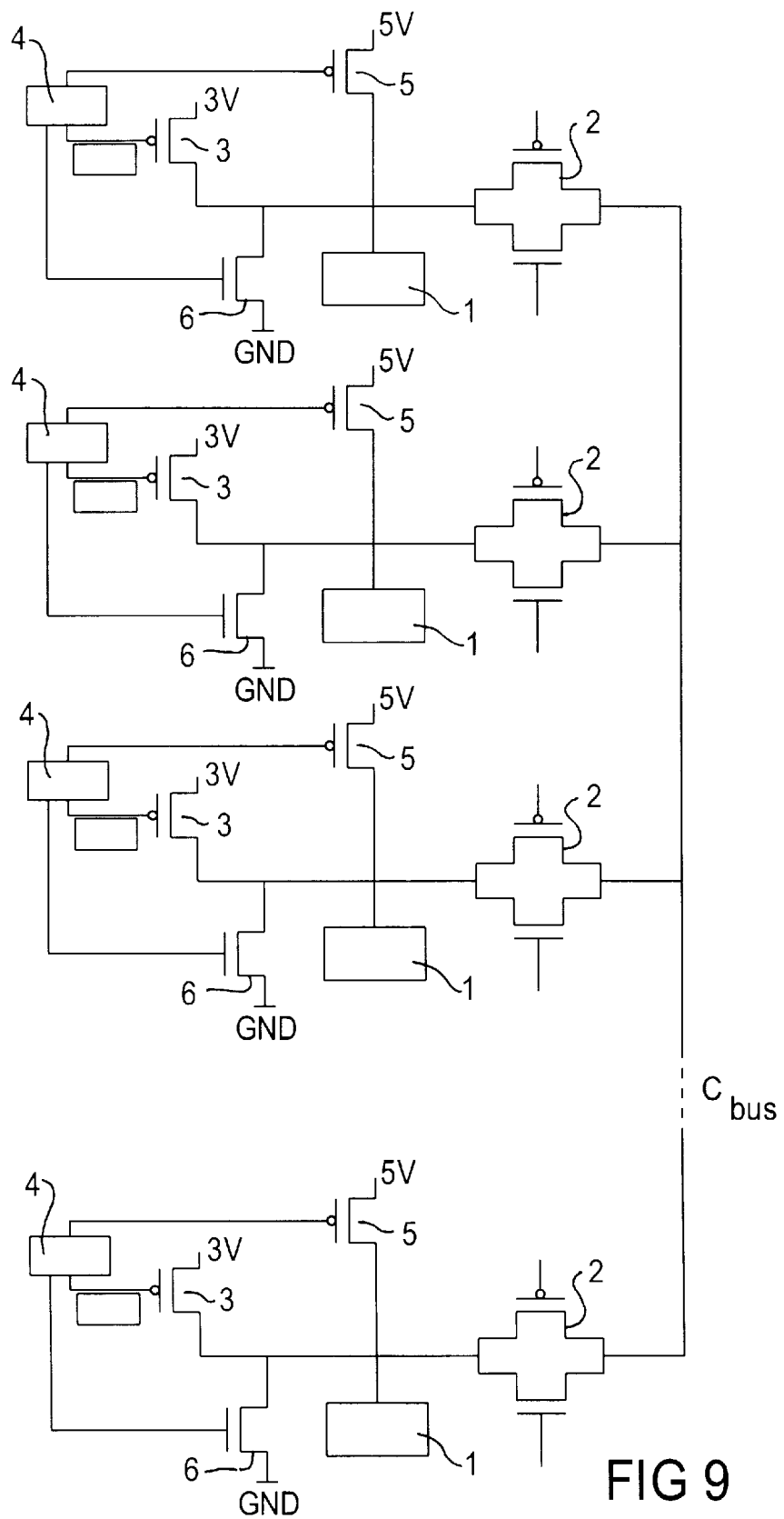
FIG. 9 shows an implementation of a plurality of I/O pads of an I/O system according to the preferred embodiment of the invention in an integrated circuit.

FIG. 9 shows an implementation of a plurality of I/O pads in an I/O system according to the invention. The transmission gates 2 each of which is connected to one of the respective I/O pads 1 are interconnected via a charge sharing bus $C_{bus}$ enabling the simultaneous charging and discharging of the I/O pads 1 to the preload voltage depending on the initial (i.e. LOW or HIGH) charging state of the respective I/O pads.

Figure 7:
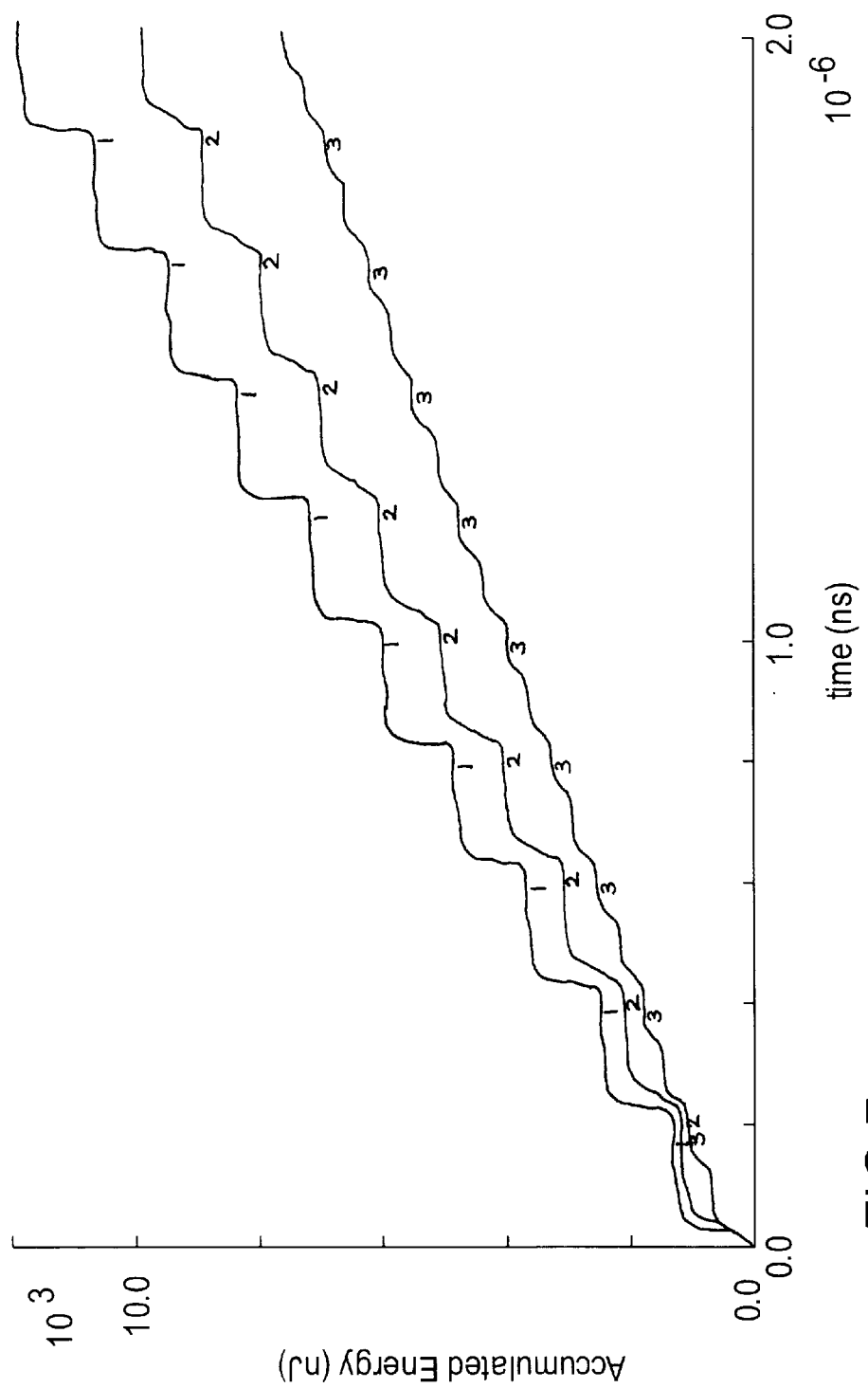
FIG. 7 shows a graph of the energy consumption of the I/O system according to the preferred embodiment of the invention and of conventional I/O pads.

The low-power I/O system has been simulated in 0.5 $\mu$m technology. FIG. 7 shows the power saving achieved by conventional stepwise charging and by a combination of stepwise charging and charge sharing according to the invention.

Three curves show the accumulated energy flowing out of the 3V power supply and of the 5V power supply. This has been obtained by integrating the power supply current and multiplying this by the corresponding power supply voltage. The topmost curve (1) shows the $CV^2f$ limit (plus overheads of switching circuitry). The second curve (2) shows the accumulated energy if the I/O system allows for stepwise charging but not charge sharing. The lowest curve (3) shows the power savings achieved by the interconnected linking of both techniques according to the invention using the I/O system according to the preferred embodiment.

The I/O system according to the preferred embodiment of the invention has further been simulated over a range of voltages, temperatures and ranges of capacitive loads (pads). The results of this particular simulation are tabulated below for $V_{dd}$=5V, Temp=25° C., nominal parameters and N=10 where N stands for number of rising edge transitions on the capacitive loads.

TABLE 1

| Cload | Energy in $10^3$ pJ (Normal design) | Energy in $10^3$ pJ (Low-power design) | Rise time Normal design (ns) | Rise time Low-power design (ns) | Power savings in % |
|---|---|---|---|---|---|
| 10 pf | 4.163 | 2.914 | 5.833 | 18.14 | 30.0 |
| 20 pf | 6.499 | 4.554 | 9.427 | 19.70 | 29.9 |
| 30 pf | 8.886 | 6.221 | 13.12 | 21.35 | 29.9 |
| 40 pf | 11.28 | 7.949 | 16.80 | 23.84 | 29.5 |
| 50 pf | 13.72 | 9.816 | 20.45 | 26.36 | 28.4 |
| 60 pf | 16.15 | 11.72 | 24.09 | 26.88 | 27.4 |
| 70 pf | 18.59 | 13.71 | 27.72 | 32.58 | 26.2 |
| 80 pf | 21.03 | 15.77 | 31.34 | 35.89 | 25.0 |
| 90 pf | 23.48 | 17.89 | 34.94 | 39.38 | 23.8 |
| 100 pf | 25.93 | 20.09 | 38.51 | 43.03 | 22.5 |

Table 1 compares the power dissipation of a conventional I/O system with the low-power I/O system according to the preferred embodiment of the invention. Both systems use the same 5V driver size.

The energy savings in this particular simulation range from 20% to 30% and tend to decline with the increasing capacitive load because of lower shared voltage due to higher RC time constant during charge sharing. The time during which charge sharing was enabled is shorter than the RC time constant. Also the 3V driver 3 was not sized large enough for a 100 pf load and as a result did not raise the load voltage to a full 3.3 volts in the second step of the staggered charging process.

The low-power I/O system according to the invention has a higher intrinsic rise time (15 ns) due to time allocated for stepwise charging and charge recycling.

The circuitry of the low-power I/O system according to the invention can be applied to any kind of digital integrated circuits, e.g. memories, bit line precharge, word line drivers, inside ASICs, clock signal drivers, internal bus drivers, etc.

Further, according to the invention, no additional power supplies are required since the invention uses the same power supplies as are already integrated in a mixed voltage environment, e.g. the 3V power supply and the 5V power supply, as intermediate power supply and operating power supply, respectively.

The low-power I/O system according to the invention occupies twice the area of the conventional I/O system due to additional area needed for the 3V P-drivers and the charge sharing pass transistors. An additional metal bus for the charge recycling has been used.

In 3V battery-operated systems the dual power supply rail is preferably derived from multiple battery taps. Apart from battery life additional motivation for low-power techniques stems from package heat dissipation considerations.

Unlike conventional I/O systems the I/O system according to the invention does not need additional pins for recycling capacitors or additional silicon area for on-chip capacitors. The I/O system according to the invention has been designed and simulated in a 0.5 $\mu$m process and achieves a power savings of 20% to 30% of $CV^2f$.

What is claimed is:

1. Method for low-power charge transition in an integrated-circuit I/O system which comprises a plurality of capacitive loads which convert between a charged state at an operating voltage and a discharged state at ground during each of operation cycles of the I/O system, wherein the operation cycles are predetermined by an external clock signal, and of which plurality of said capacitive loads a first number of capacitive loads having the charged state converts from the charged state to the discharged state at ground, and a second number of capacitive loads having the discharged state converts from the discharged state to the charged state at the operating voltage, the method comprising the steps of:

sharing the charge of said first number of capacitive loads having the charged state between said first number of capacitive loads and said second number of capacitive loads having the discharged state, thereby charging said second number of capacitive loads from ground to a preload voltage and discharging said first number of capacitive loads from said operating voltage to said preload voltage, charging said second number of capacitive loads having been charged to said preload voltage from said preload voltage to an intermediate voltage between said preload voltage and said operating voltage, and charging said second number of capacitive loads having been charged to said intermediate voltage from said intermediate voltage to said operating voltage.

2. Method according to claim 1, further comprising the step of discharging said first number of capacitive loads from said operating voltage to ground.

3. Method according to claim 1, wherein the step of sharing the charge comprises the steps of:

connecting said first number of capacitive loads to said second number of capacitive loads for a predetermined first duration by respective transmission gates and control units assigned thereto, thereby sharing the charge stored in said first number of capacitive loads between said first number of capacitive loads and said second number of capacitive loads, wherein said control units provide said transmission gates with a transmission signal turning on said transmission gates for bidirectional current flow for said predetermined first duration.

4. Method according to claim 3, wherein said first number of capacitive loads and said second number of capacitive loads are connected via said transmission gates to a common charge sharing bus.

5. Low-power I/O system of an integrated circuit for low-power charge transition in said I/O system, comprising a plurality of capacitive loads which convert between a charged state at an operating voltage and a discharged state at ground during each of the operation cycles of said I/O system, wherein the operation cycles are predetermined by an external clock signal, and of which plurality of said capacitive loads a first number of capacitive loads having said charged state converts from said charged state to said discharged state at ground and a second number of capacitive loads having said discharged state converts from said discharged state to said charged state at the operating voltage, an intermediate power supply for providing an intermediate voltage, an operating power supply for providing an operating voltage, and per each capacitive load a transmission gate connected to said capacitive load for connecting said first number of capacitive loads to said second number of capacitive loads, an intermediate driver connected between said capacitive load and said intermediate power supply, an operating driver connected between said capacitive load and said operating power supply, and a control unit connected to said transmission gate, said intermediate driver and said operating driver, wherein the control units sequentially connect said second number of capacitive loads to said first number of capacitive loads through said transmission gates for a first duration by controlling the respective transmission gates, to said intermediate power supply for a second duration by controlling the respective intermediate drivers, and to said operating power supply for a third duration by controlling the respective operating drivers.

6. Low-power I/O system according to claim 5, further comprising a charge sharing bus, wherein said transmission gates are connected to said charge sharing bus through which charge sharing is performed between said first number of capacitive loads and said second number of capacitive loads when the said transmission gates are turned on by the respective control units.

7. I/O system according to claim 5, wherein said control units are formed as a single control device and arranged together with said transmission gates, said intermediate drivers and said operating drivers on one integrated circuit chip.

8. I/O system according to claim 7, wherein said integrated circuit chip further comprises said capacitive loads.

9. I/O system according to claim 7, wherein said integrated circuit chip further comprises said intermediate power supply and said operating power supply.

* * * * *